(12) United States Patent
Chakravarty

(10) Patent No.: US 8,228,750 B2
(45) Date of Patent: Jul. 24, 2012

(54) LOW COST COMPARATOR DESIGN FOR MEMORY BIST

(75) Inventor: Sreejit Chakravarty, Mountain View, CA (US)

(73) Assignee: LSI Corporation, Milpitas, CA (US)

( * ) Notice: Subject to any disclaimer, the term of this patent is extended or adjusted under 35 U.S.C. 154(b) by 22 days.

(21) Appl. No.: 12/879,110

(22) Filed: Sep. 10, 2010

(65) Prior Publication Data

US 2012/0063248 A1 Mar. 15, 2012

(51) Int. Cl.
*G11C 29/00* (2006.01)

(52) U.S. Cl. ............. 365/201; 365/189.07; 365/189.08; 365/189.02; 365/233.11

(58) Field of Classification Search .................. 365/201, 365/189.07, 189.08, 189.02, 233.11
See application file for complete search history.

(56) References Cited

U.S. PATENT DOCUMENTS

2009/0138772 A1* 5/2009 Bertacco et al. .............. 714/733
* cited by examiner

*Primary Examiner* — Thong Q Le

(57) ABSTRACT

A comparator determines the fidelity of a response vector received from a memory under test. The comparator includes a first logic gate configured to output a first value that is the logical OR of a first proper subset of bits of the response vector. A second logic gate is configured to output a second value that is the logical NAND of the proper subset of bits. A first multiplexer is configured to select between the first and second values based on the value of a first bit of a check vector corresponding to the response vector.

20 Claims, 7 Drawing Sheets

LOW COST COMPARATOR DESIGN FOR MEMORY BIST

TECHNICAL FIELD

This application is directed, in general, to an electronic device, and, more specifically, to self-testing thereof.

BACKGROUND

Electronic devices such as integrated circuits sometimes include self-test circuitry that may be used to determine device functionality before or after deployment of the device in a product. Such circuitry adds significantly to the area needed to implement the device, for example on a semiconductor substrate of an integrated circuit, increasing the cost of manufacturing the device. The area consumed by the test circuitry sometimes makes it necessary for a manufacturer to either reduce the number of device die placed on a production wafer, or to forgo additional functionality on the device die.

SUMMARY

One aspect provides a comparator for determining the fidelity of a response vector output by a memory under test. The comparator includes a first logic gate configured to output a first value that is the logical OR of a first proper subset of bits of the response vector. A second logic gate is configured to output a second value that is the logical NAND of the proper subset of bits. A first multiplexer is configured to select between the first and second values based on the value of a first bit of a check vector corresponding to the response vector.

Another aspect provides a method of manufacturing an electronic circuit. The method includes providing a semiconductor substrate, and forming a test controller thereon that is configured to output a test vector and a check vector corresponding to the test vector. A memory is configured to store a test vector and to output a corresponding response vector at a memory output. A comparator is formed that is configured to receive the response vector and the check vector. Forming the comparator includes configuring a first logic gate to output a first value that is the logical OR of a proper subset of bits of the response vector. A second logic gate is configured to output a second value that is the logical NAND of the proper subset of bits. A first multiplexer is configured to select between the first and second values based on the value of a first bit of the check vector.

Yet another aspect provides an integrated circuit that includes a semiconductor substrate having a memory and a memory test controller formed thereon. The test controller is configured to output a test vector and a check vector corresponding to the test vector. The memory is configured to store the test vector and to output a response vector at a memory output. A comparator is formed on the substrate and configured to receive the response vector and the check vector. The comparator includes a first logic gate configured to output a first value that is the logical OR of a proper subset of bits of the response vector, and a second logic gate configured to output a second value that is the logical NAND of the proper subset of bits. A first multiplexer is configured to select between the first and second values based on the value of a first bit of the check vector.

BRIEF DESCRIPTION

Reference is now made to the following descriptions taken in conjunction with the accompanying drawings, in which.

DETAILED DESCRIPTION

This disclosure provides a novel architecture for a comparator for use in, e.g. built-in self-test (BIST) logic that may be used to test core memory of an electronic device such as an integrated circuit. Various embodiments presented herein and otherwise within the scope of the disclosure provide the ability to implement the comparator function using significantly less area of the electronic device for the BIST logic than conventional approaches. The reduction of area using simple logic gates in a novel configuration allows for a smaller die size of the device and/or a greater number of gates available to implement value-added functionality of the device.

Figure 1:
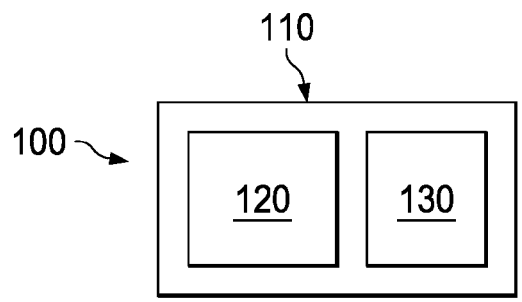
FIG. 1 illustrates an electronic device of the disclosure, including a logic block and a self-test block.

Herein various conventions are used to represent digital data, as follows:

a leading hash mark ("#") indicates the value is hexadecimal a leading percent mark ("%") indicates the value is binary binary value of "1" may be referred to as TRUE binary value of "0" may be referred to as FALSE Turning initially to FIG. 1, illustrated is an electronic device 100. The electronic device 100 is illustrated including a semiconductor die 110, such as an integrated circuit (IC). While embodiments of the disclosure may be particularly advantageous in the context of IC manufacturing and test, such embodiments are not limited to integrated circuits.

Upon the die 110 are formed a logic block 120 and a self-test block 130. The blocks 120, 130 are illustrated as contiguous blocks on the die 110 to provide scale of the portions relative to the total area of the die 110 consumed thereby. In practice, however, elements of the self-test block 130 are often interspersed with elements of the logic block 120 as necessary to meet overall design objectives. The self-test block 130 often consumes 10-20% of the available area of the die 110, thereby increasing the cost of the die 110. Thus, there is a significant financial barrier to adding additional self-test circuitry. Moreover, a reduction of the area required to implement a portion of the self-test block 130 that is repeated numerous times may result in sufficient space savings to implement additional value-added logic functions on the die 110 and/or increase the number of die 110 that may be formed on a single semiconductor wafer.

Figure 2:
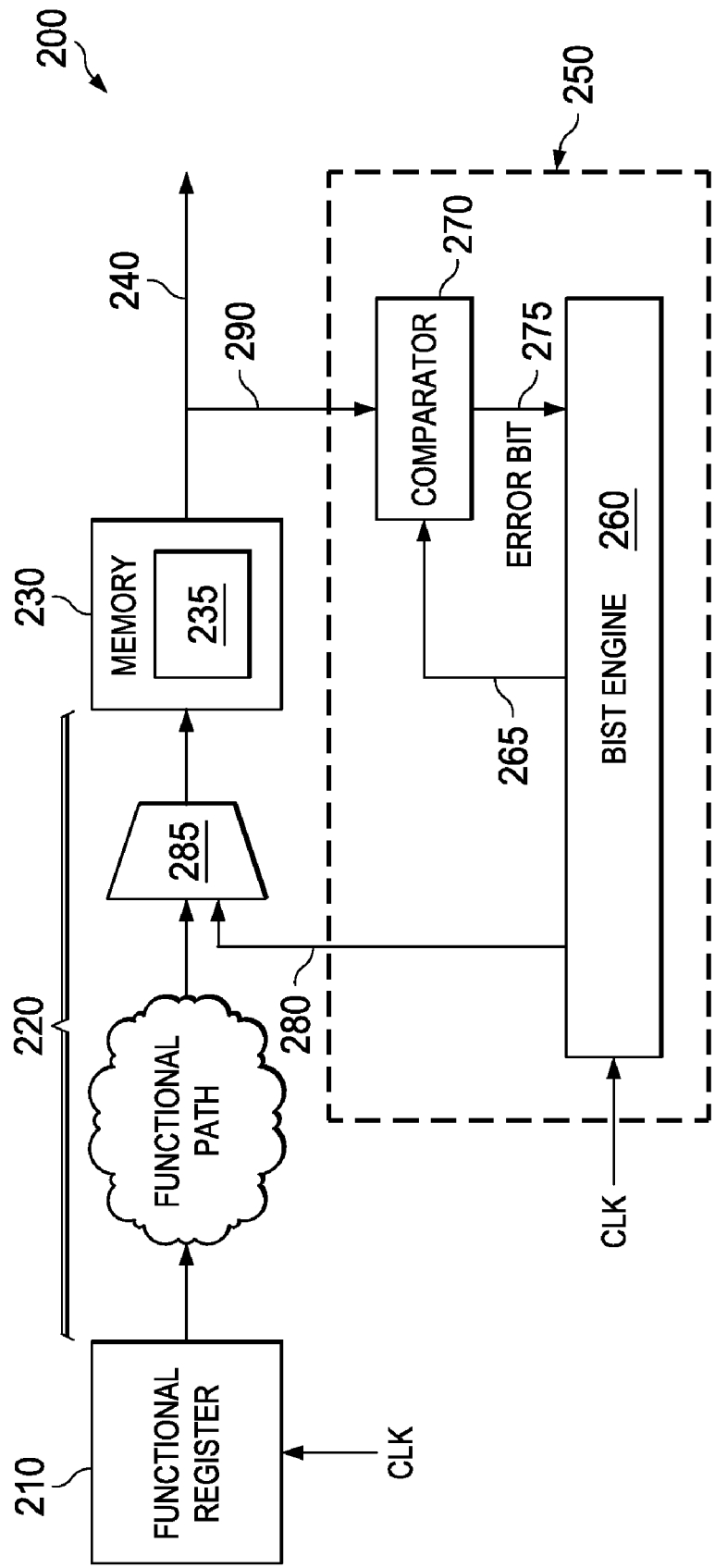
FIG. 2 illustrates an embodiment of a self-test block configured to test a memory.

FIG. 2 illustrates an embodiment of a self-test architecture 200 in accordance with the disclosure. In the course of operation of the device 100, a functional register 210 clocked by a system CLK provides data via a functional path 220 to an input of a memory 230. The functional register 210, functional path 220 and the memory 230 may be conventional. The functional register 210 is representative of the numerous ways in which functional circuitry of the device 100 may provide data to the memory 230. The functional path 220 may include, e.g., one or more of metal interconnects, logic gates, and discrete circuit elements (e.g., resistors and capacitors) as needed to implement the design of the device 100.

The memory 230 includes a memory register 235, e.g. persistent storage of digital data, and supporting circuitry such as address decoders, multiplexers, and discrete logic elements (not shown). The memory 230 may be a core memory of an integrated circuit, meaning the memory 230 is part of the physical layout of the integrated circuit, and not external thereto. In the course of conventional operation, the memory 230 may be used by the device 100 to store data, and later to provide the data via an output data path 240 from an output of the memory 230. The output data path 240 may include a plurality of bit paths, with one bit path corresponding to each bit of the output of the memory 230. In a typical configuration, the data path 240 is 16 or 32 bits wide, though embodiments of the disclosure are not so limited.

A test controller 250 includes a built-in self-test (BIST) engine 260 and a comparator 270. The test controller 250 is configured to apply test vectors 280 to the memory 230. As used herein, a test vector is a combination of bits configured to test an aspect of operation of the memory 230. For example, the test vectors 280 may include hexadecimal words representing particular bit patterns, such as #0000, #FFFF, #5555, #AAAA, #3333 and #CCCC. The test vectors 280 may be conventionally routed to the memory 230 via a multiplexer 285 and supporting control circuitry.

The comparator 270 is configured to receive from the memory 230 response vectors 290 corresponding to the test vectors 280. In this context, "corresponding" means the particular response vector 290 is read from a read address location that is selected to test the fidelity (e.g. accuracy of storage and retrieval) of data stored in a write address location to which a particular test vector 280 is stored. The response vectors 280 thus provide information regarding the functionality of the address locations and associated decode circuitry and data paths within the memory 230. For the purpose of discussion herein the response vectors 290 are taken without limitation to be 16 bits designated $QM_x$, where x=15 ... 0.

The BIST engine 260 is further configured to provide check vectors 265 to the comparator 270. The check vectors 265 are selected to correspond to particular test vectors 280 and response vectors 290, as described further below. While not limited to any particular width, in some embodiments the check vectors 265 consist of two bits, % a and % b, and are denoted % ab. In other embodiments the check vectors 265 consist of four bits, denoted % abcd. Aspects of the check vectors 265 are discussed further below.

As discussed further below the comparator 270 provides an error bit 275 to the BIST engine 260 in the event that a test of a particular response vector 290 indicates a difference between the response vector 290 and the corresponding test vector 280. The BIST engine 260 may be configured to conventionally perform an action in the event that the comparator 270 asserts the error bit 275. For example, the action may include generating an alert signal, or disabling operation of the device 100.

Figure 3:
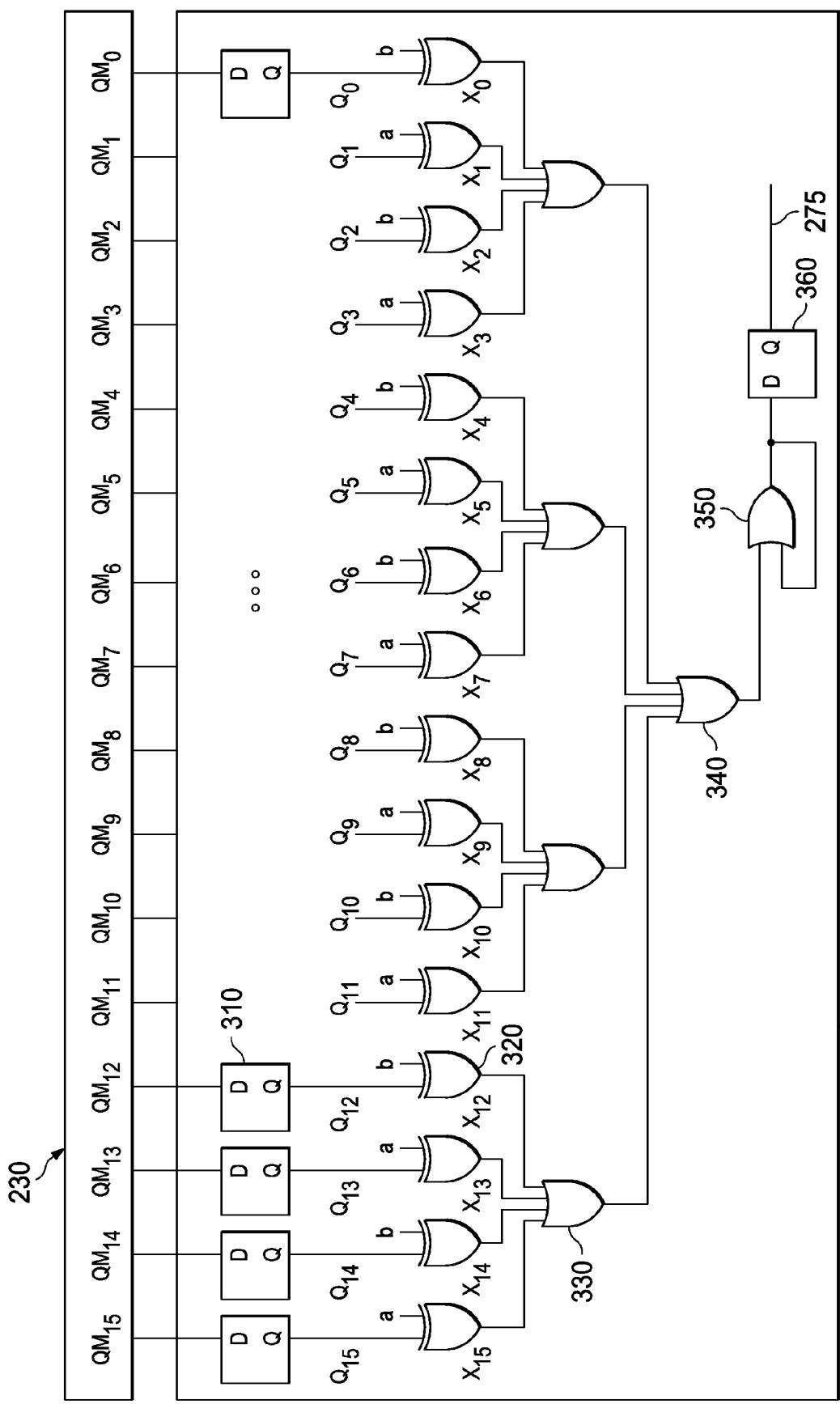
FIG. 3 illustrates prior art comparator.

FIG. 3 illustrates for discussion purposes a conventional implementation of a comparator 300 as might be used in a conventional design of the test controller 250. The memory 230 outputs 16 data bits $QM_x$, where x=15 ... 0. Each bit $QM_x$ is conventionally stored by a corresponding latch (e.g. a D flip-flop) 310 clocked by a system clock. An XOR gate 320 corresponding to each bit $QM_x$ of the response vector receives the corresponding bit $QM_x$ and a bit from a check value such as the check vector 265. In the illustrated example, the check value is a 2-bit value % ab. The check value bit provided to each XOR gate 320 alternates between % a and % b.

The check value bit received by each XOR gate 320 corresponds to an expected value of the bit $QM_x$ received by that XOR gate 320. Thus, for example, when a bit $QM_x$ received by a particular XOR gate 320 is expected to be TRUE, then the check value bit provided to that XOR gate 320 is also TRUE. As an example, TABLE I lists some check values (CV) that may be checked for error by corresponding check vectors % ab.

TABLE II

| % ab | CV |
|------|-------|
| 00   | #0000 |
| 01   | #5555 |
| 10   | #AAAA |
| 11   | #1111 |

If any of the bits $QM_x$ fail to match the expected value as determined by the corresponding check value, the XOR gate 320 that receives the mismatched bit outputs a TRUE value. OR gates 330 receive outputs from a corresponding four of the XOR gates 320. If any of the values received by a particular OR gate 330 is TRUE, then that particular OR gate 330 also outputs a TRUE value. An OR gate 340 receives outputs from the four OR gates 330 and outputs a TRUE value if any received value is TRUE.

An OR gate 350 receives the output of the OR gate 340. The OR gate 350 is configured to feed back its output to one of two inputs. The effect of this configuration is to latch a received TRUE value. That is, once a TRUE value is received by the OR gate 350, the output of the OR gate 350 remains TRUE until the OR gate 350 is reset by some means. This TRUE value represents the occurrence of a comparator error. A latch 360 triggered by the system clock phase-aligns the error signal to the clock.

The die area of an example implementation of the conventional comparator 300 may be computed for later reference in this discussion. One implementation of the conventional comparator 300 includes 18 NOT gates, 17 flip-flops, 16 XOR gates, and five 4-input OR gates. The area of these devices may be conveniently expressed as an equivalent number of four-input NAND (NAND4) gates. Using this reference, the 16-bit conventional comparator 300 consumes an area equivalent to about 171 NAND4 gates. Similarly, a 32-bit implementation may be equivalent to about 334 NAND4 gates.

Figure 4:
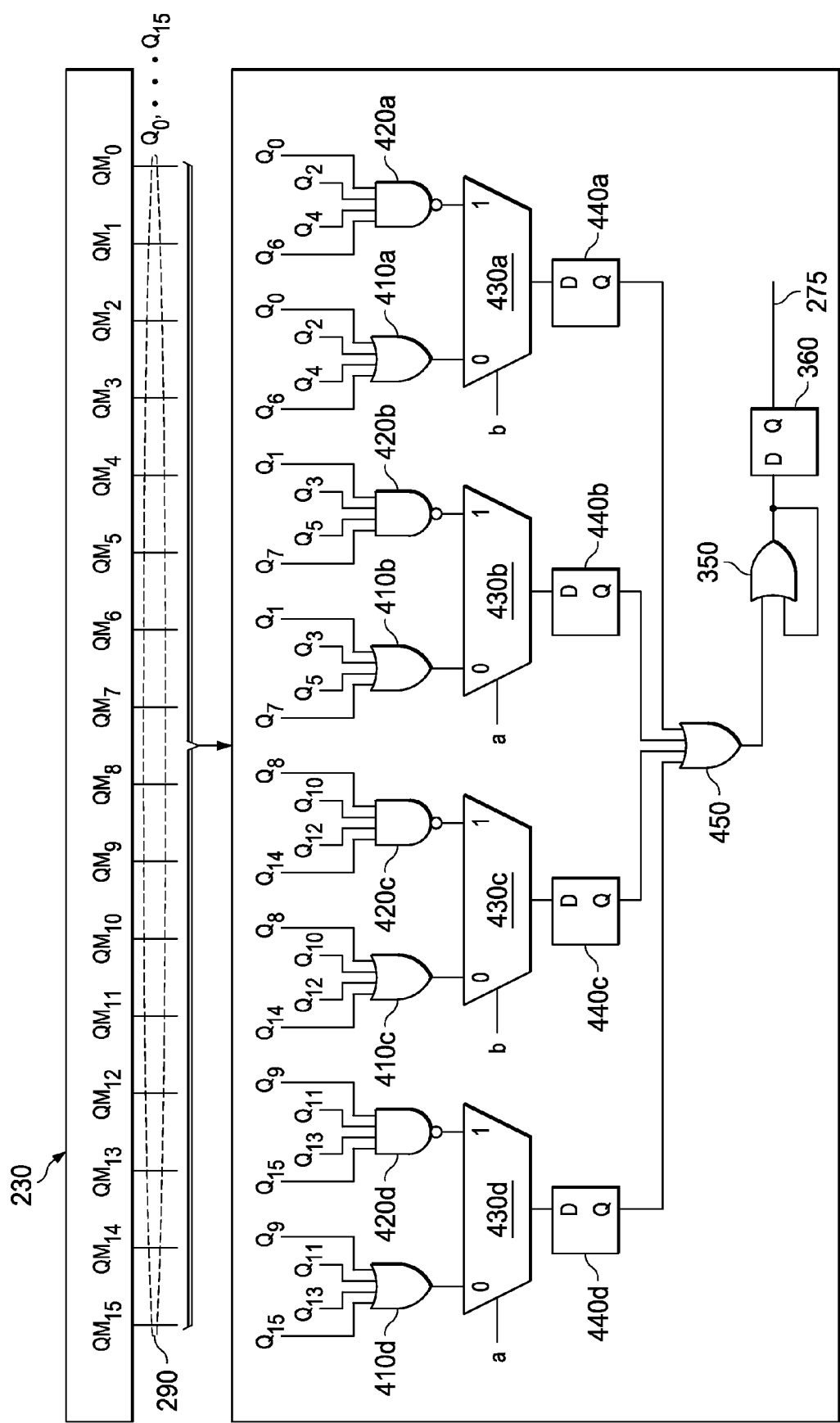
FIG. 4 illustrates a comparator of the disclosure that includes a multiplexer bank and an OR gate that receives outputs of the multiplexers, with a latch located between each multiplexer and the OR gate.

FIG. 4 illustrates a comparator 400 of the disclosure that consumes significantly less area on the device 100 than does the conventional comparator 300, while providing similar functionality. The comparator 400 is illustrated without limitation for the case that the memory 230 has a 16-bit width, and the check vectors 265 consist of two bits, % a and % b. For the purpose of discussion the output of the memory 230 is again designated $QM_{15} \ldots QM_0$.

An OR gate 410a and a NAND gate 420a each receive a first proper subset of the output bits $QM_{15} \ldots QM_0$. The bits $QM_{15} \ldots QM_0$ map to bits $Q_{15} \ldots Q_0$ received by the comparator 400. The first proper subset includes bits of $QM_{15} \ldots QM_0$ that are expected to simultaneously be equal to the same logical value in the response vector 290. In the illustrated nonlimiting example, the proper subset consists of the even bits of the lower word ($QM_7 \ldots QM_0$) of $QM_{15} \ldots QM_0$, e.g. $Q_6, Q_4, Q_2, Q_0$.

An OR gate 410b and a NAND gate 420b each receive a second proper subset of the bits $QM_{15} \ldots QM_0$. The second proper subset also includes bits of $QM_{15} \ldots QM_0$ that are expected to simultaneously be equal to each other in the response vector 290. The first and second proper subsets are disjoint, e.g. no bits are members of both subsets. In this example, the second proper subset consists of the odd bits of the lower word of $QM_{15} \ldots QM_0$, e.g. $Q_7, Q_5, Q_3, Q_1$. Similarly, an OR gate 410c and a NAND gate 420c each receive even bits of the upper word of $QM_{15} \ldots QM_0$ ($QM_{15} \ldots QM_0$), e.g. $Q_{14}, Q_{12}, Q_{10}, Q_8$, and an OR gate 410d and a NAND gate 420d each receive odd bits of $QM_{15} \ldots QM_8$, e.g. $Q_{15}, Q_{13}, Q_{11}, Q_9$.

Those skilled in the pertinent art will appreciate that the OR gates 410a, 410b, 410c, 410d (collectively OR gates 410) may be equivalently represented by a de Morgan equivalent gate, e.g. an AND gate with inverted inputs and output. Similarly, the NAND gates 420a, 420b, 420c, 420d (collectively NAND gates 420) may be equivalently represented by an OR gate with inverted inputs. The logic function provided by the OR gates 410 and the NAND gates 420 may be provided by any means, such as discrete transistors, logic gates or a programmable logic array (PLA).

A multiplexer 430a receives the outputs of the OR gate 410a and the NAND gate 420a. The bit % b of the check vector 265 selects between the multiplexer 430a inputs for output thereby. A latch 440a receives the output of the multiplexer 430a. A multiplexer 430b receives the outputs of the OR gate 410b and the NAND gate 420b. The bit % a of the check vector 265 selects between the multiplexer 430b inputs for output thereby. A latch 440b receives the output of the multiplexer 430b. A multiplexer 430c and latch 440c operate as described for the multiplexer 430a and latch 440a, but with respect to the bits $Q_{14}, Q_{12}, Q_{10}, Q_8$, and a multiplexer 430d and latch 440d operate as described for the multiplexer 430b and latch 440b, but with respect to the bits $Q_{15}, Q_{13}, Q_{11}, Q_9$. The latches 440a, 440b, 440c, 440d (collectively latches 440) are clocked by the CLK signal (not shown).

An OR gate 450 receives the outputs of the latches 440. As described previously the OR gate 350 and the latch 360 capture the output of the OR gate 450 and phase align the result with the CLK.

In the comparator 400, each multiplexer 430a, 430b, 430c, 430d (collectively multiplexers 430) is associated with a different proper subset of $QM_{15} \ldots QM_0$. The control input of each multiplexer 430, e.g. % a or % b, may be chosen when configuring the check vectors 265 to select the output of the associated OR gate 410 or NAND gate 420 depending on whether the expected value of the proper subset of bits is TRUE or FALSE. For example, if $QM_7, QM_5, QM_3$, and $QM_1$ are expected to be TRUE, % a in the check vector 265 is chosen to be TRUE so the output of the NAND gate 420a is selected. Thus, whenever any one of the bits $QM_7, QM_5, QM_3$, and $QM_1$ is FALSE, the output of the multiplexer 430a will be TRUE. If instead $QM_7, QM_5, QM_3$, and $QM_1$ are expected to be FALSE, % a in the check vector 265 is chosen to be FALSE so the output of the OR gate 410b is selected. Thus, whenever any one of the bits $QM_7, QM_5, QM_3$, and $QM_1$ is TRUE, the output of the multiplexer 430b will be TRUE. The TRUE value from the multiplexer then propagates to the error bit 275 to indicate the occurrence of a mismatch between a bit of the response vector 290 and its expected value.

Table II illustrates by way of several examples the operation of the comparator 400, focusing on $QM_7 \ldots QM_0$. The operation of the comparator 400 with respect to $QM_{15} \ldots QM_8$ is directly analogous to the operation with respect to $QM_7 \ldots QM_0$.

In example 1 in TABLE II, the BIST engine 260 writes a test vector 280 with the value #0000 (16 zeros) to the memory 230. If the memory 230 and intervening connections are properly working, $Q_7Q_5Q_3Q_1$ and $Q_6Q_4Q_2Q_0$ should both equal %0000. If any of $Q_6Q_4Q_2Q_0$ is TRUE ($Q_0$ in the example), then the OR gate 410a outputs a TRUE value. The BIST engine 260 sends a check vector 265 value of %00 to the comparator 400. Thus, the multiplexers 430a, 430b respectfully select the outputs of the OR gates 410a, 410b. The TRUE value output by the OR gate 410a is output by the multiplexer 430a and stored by the latch 440a. The output of the latch 440a causes the OR gate 450 to output a TRUE value, which then propagates to the error bit 275 output as previously described.

In example 2 in TABLE II, the BIST engine 260 writes a test vector 280 with the value #5555 to the memory 230. Thus $Q_6Q_4Q_2Q_0$ is expected to be %1111 and $Q_7Q_5Q_3Q_1$ is expected to be %0000. If any of $Q_7Q_5Q_3Q_1$ is TRUE ($Q_5$ in the example), then the OR gate 410b outputs a TRUE value. The BIST engine 260 sends a check vector 265 value of %01 to the comparator 400. Thus, the multiplexer 430b selects the TRUE value output by the OR gate 410b and the multiplexer 430a selected the FALSE value output by the NAND gate 420a. The TRUE value output by the multiplexer 430b is stored by the latch 440b. The output of the latch 440b then propagates to the error bit 275 output as previously described.

In example 3 in TABLE II, the BIST engine 260 writes a test vector 280 with the value #AAAA to the memory 230. Thus $Q_6Q_4Q_2Q_0$ is expected to be %0000 and $Q_7Q_5Q_3Q_1$ is expected to be %1111. If any of $Q_7Q_5Q_3Q_1$ is FALSE (Q3 in this example), then the NAND gate 420b outputs a TRUE value. The BIST engine 260 sends a check vector 265 value of %10 to the comparator 400, so the multiplexer 430b selects the output of the NAND gate 420b, and the multiplexer 430a selects the output of the OR gate 410a. Thus, the multiplexer 430b outputs the TRUE value of the NAND gate 420b, which is stored by the latch 440b. The output of the latch 440b then propagates to the error bit 275 output as previously described.

Lastly, in example 4 in TABLE II, the BIST engine 260 writes a test vector 280 with the value #FFFF to the memory 230. Thus, both $Q_6Q_4Q_2Q_0$ and is $Q_7Q_5Q_3Q_1$ are expected to be %1111. If any of $Q_7 \ldots Q_0$ is FALSE (Q6 in the example), then the corresponding NAND gate 420a or NAND gate 420b outputs a TRUE value. The BIST engine 260 sends a check vector 265 value of %11 to the comparator 400. Thus, the multiplexers 430a, 430b respectively select the outputs of the NAND gates 420a, 420b. The output of the NAND gate 420a is TRUE in this case, and this value is stored by the latch 440a. The output of the latch 440d then propagates to the error bit 275 output as previously described.

TABLE II

| Ex. # | CV 265 % a | CV 265 % b | TV 280 | Expected Response Vector 290 $Q_7Q_5Q_3Q_1$ | Expected Response Vector 290 $Q_6Q_4Q_2Q_0$ | Received Response Vector 290 $Q_7Q_5Q_3Q_1$ | Received Response Vector 290 $Q_6Q_4Q_2Q_0$ | 430a | 430b |
|---|---|---|---|---|---|---|---|---|---|
| 1 | 0 | 0 | # 0000 | 0000 | 0000 | 0000 | 0001 | 1 | 0 |
| 2 | 0 | 1 | # 5555 | 0000 | 1111 | 0100 | 1111 | 0 | 1 |
| 3 | 1 | 0 | # AAAA | 1111 | 0000 | 1101 | 0000 | 0 | 1 |
| 4 | 1 | 1 | # FFFF | 1111 | 1111 | 1111 | 0111 | 1 | 0 |

In each of the preceding examples, the check vector 265 corresponds to the test vector 280 and the response vector 290. In this context, "corresponds to" means that the check vector 265 is configured to test the fidelity of a particular response vector 290 that results from a particular test vector 280 that is written to the memory 230.

While FIG. 4 illustrates an embodiment for a 16-bit width of the memory 230, those skilled the pertinent art will appreciate that the memory 230 and comparator 400 may be any desired width. For example, in other embodiments, the comparator 400 may be four bytes (32 bits) wide, or any other desired width. Furthermore, the architecture of the comparator 400 may be adapted to accommodate an arbitrary test vector 280, including the use of a check vector 265 that includes four or more bits, e.g. % abcd. Necessary alteration of the comparator 400 is within the capability of one skilled in the pertinent art.

The area used to implement the comparator 400 on the electronic device 100 may again be estimated using an equivalent number of NAND4 gates. In a 16-bit-wide embodiment the comparator 400 includes 5 4-input OR gates, 4 multiplexers, 5 flip-flops and 5 NAND4 gates, for an equivalent of about 61 NAND4 gates. In a 32-bit embodiment, the comparator 400 may be shown to use an equivalent of about 112 NAND4 gates. These equivalent areas are only about 35% and 33%, respectively, of the area used by the 16-bit and 32-bit implementations of the conventional comparator 300. This reduction of area of area of the comparator 400 relative to the conventional comparator 300 frees significant area of the electronic device 100 that may be used for other purposes, or for reducing the overall size of the die 110.

In various embodiments the latches 440 may be interrogated individually in the event that the error bit 275 indicates an error has been detected. Thus, a diagnostic routine may be used to isolate the source of the error to a particular subset of bits of $Q_{15} \ldots Q_0$. Such knowledge may assist the diagnostic routine in determining an appropriate response to the comparison error.

Figure 5:
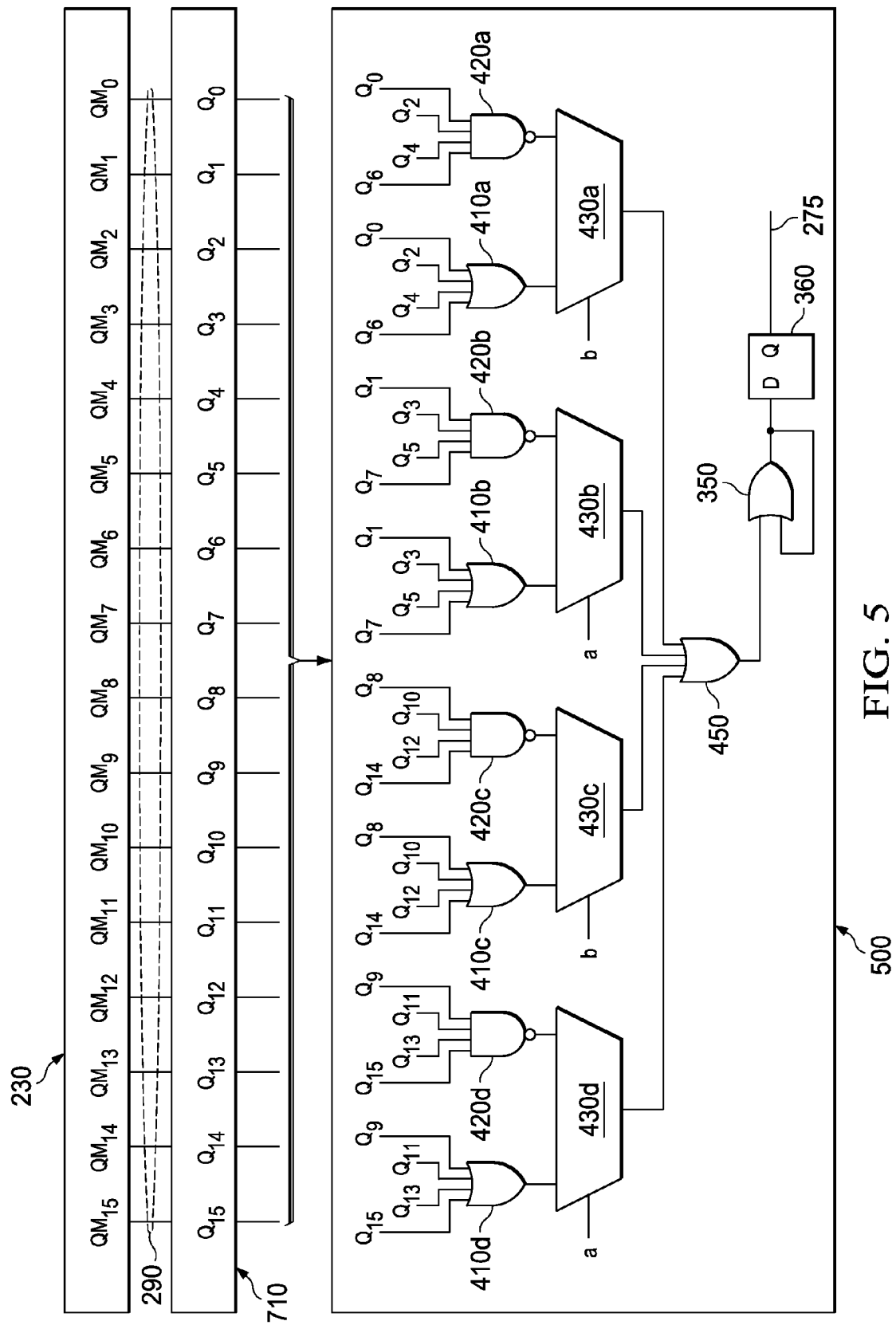
FIG. 5 illustrates a comparator of the disclosure that includes a clocked buffer array, in which the OR gate directly receives the output of the multiplexers without intervening latches.

FIG. 5 illustrates an embodiment of a comparator 500. In this embodiment the OR gate 450 directly receives the values output by the multiplexers 430. Herein "directly receives" means that the OR gate 450 receives the values output by the multiplexers 430 without any intervening logic elements. This definition does not exclude the use of intervening buffers that are not configured to change the logical state of the values.

A buffer array 710 buffers the response vector 290 received by the gates 410, 420 from the memory 230. The comparator 500 provides for the further reduction of area consumed by the test controller 250. This point is described further with reference to FIGS. 6 and 7.

Figure 6:
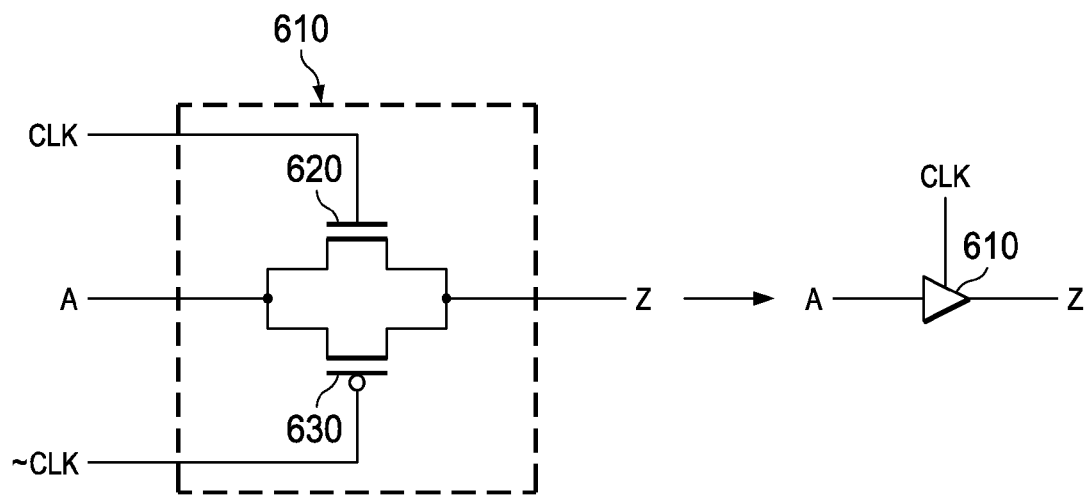
FIG. 6 illustrates a clocked buffer.

FIG. 6 illustrates a clocked buffer 610, sometimes referred to synonymously as a strobed buffer. Operation of the clocked buffer is described in U.S. patent application Ser. No. 12/854,682, incorporated herein by reference. In summary, the clocked buffer 610 includes a first MOSFET 620 and a complementary second MOSFET 630 connected in parallel between an input A and an output Z. When the CLK signal is active (high), both the first and second MOSFETS 620, 630 are turned on, creating a relatively low-resistance path between A and Z. When the CLK signal is inactive (low), A and Z are conductively isolated.

Figure 7:
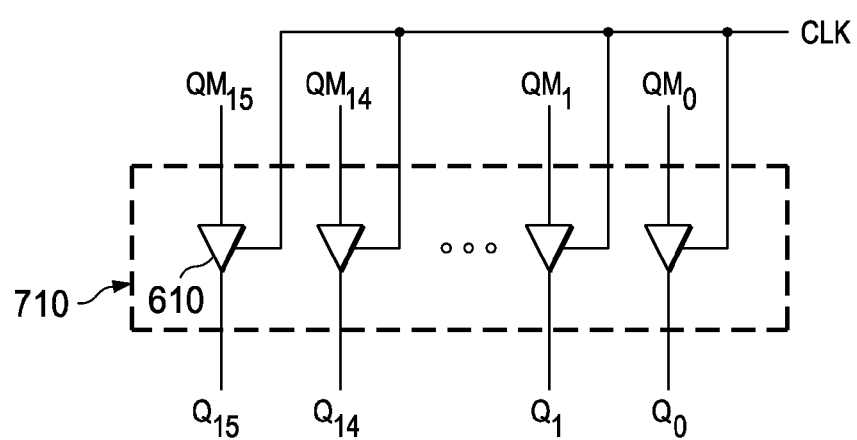
FIG. 7 illustrates a clocked buffer array that includes a plurality of the clocked buffers of FIG. 6.

FIG. 7 illustrates the buffer array 710 of clocked buffers 610, each controlled by the CLK signal. The buffer array 710 may include one clocked buffer 610 for each output bit of the memory 230.

If the outputs of the memory 230 are latched, which is typically the case, then the buffer array 710 may advantageously buffer the signals between the memory 230 outputs and the inputs to the gates 410, 420. As long as the memory outputs are stable for at least about the duration of the active phase of the CLK the buffer array 710 renders the latches 440 unnecessary. Thus the area of the comparator 500 may be reduced relative to the comparator 400, resulting in additional area savings on the die 110. The buffer array 710 also in some cases provides the advantage of having no setup time requirement, simplifying timing closure in the design of the test controller 250. However, the clocked buffers 610 cannot be individually scanned, so bit-level diagnostics are not possible in this embodiment.

The area of the comparator 500 may be estimated as done previously for the comparator 400. In a 16-bit embodiment of the comparator 500 (as illustrated), the area consumed is about equal to 22 NAND4 equivalent gates. In a 32-bit embodiment, the area consumed is about equal to 43 NAND4 equivalent gates. These values represent only about one third the area needed to implement the comparator 400, and 13% of the area needed to implement the conventional comparator 300. The reduction of area of the device 100 by use of either the comparator 400 or the comparator 500 depends on the number of placements thereof on the die 110, but this reduction of area provides the designer a valuable option for overall reduction of die area.

Figure 8A:
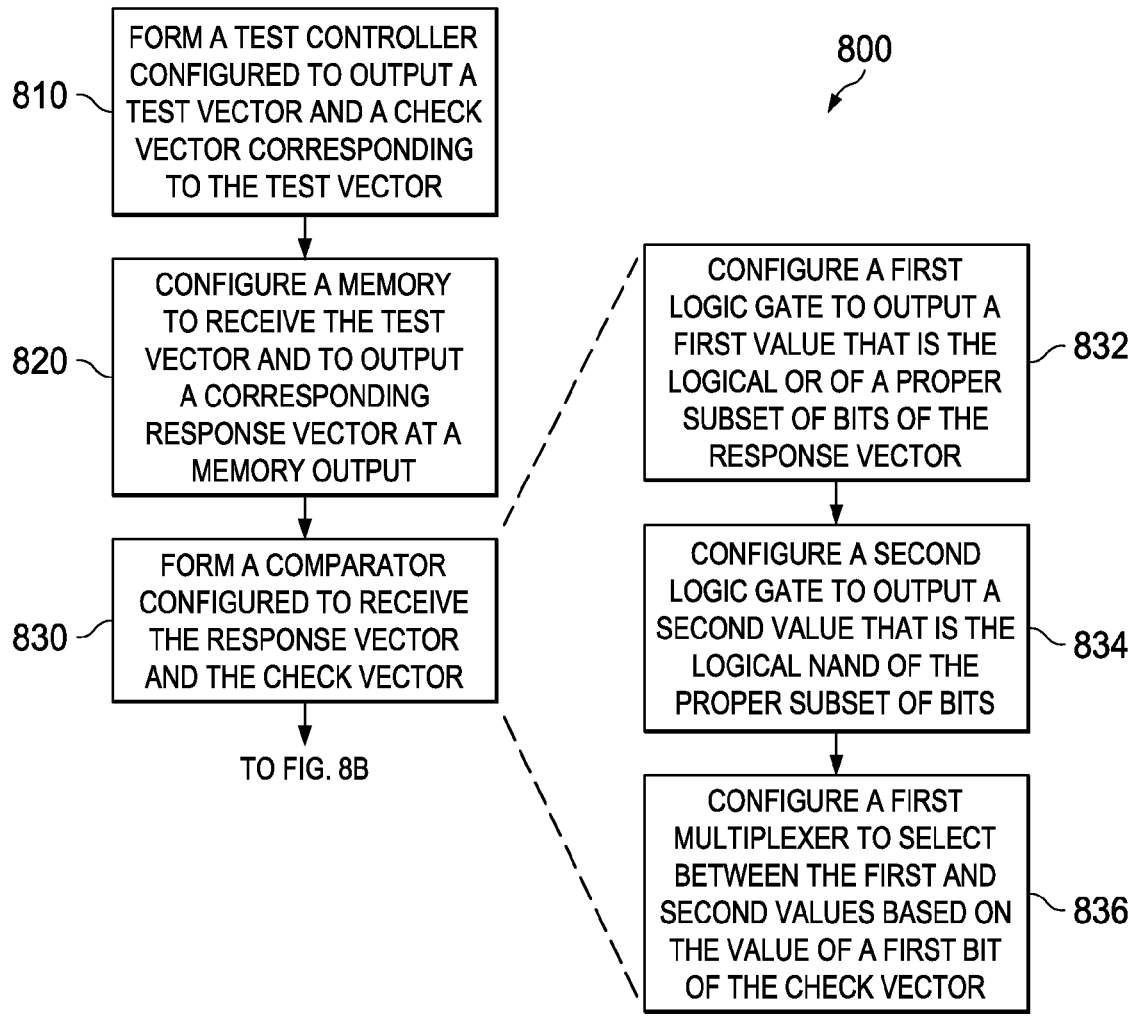
FIGS. 8A and 8B present a method of manufacturing an integrated circuit device, such as the electronic device of FIG. 1, including the self test block of FIG. 2.
Figure 8B:
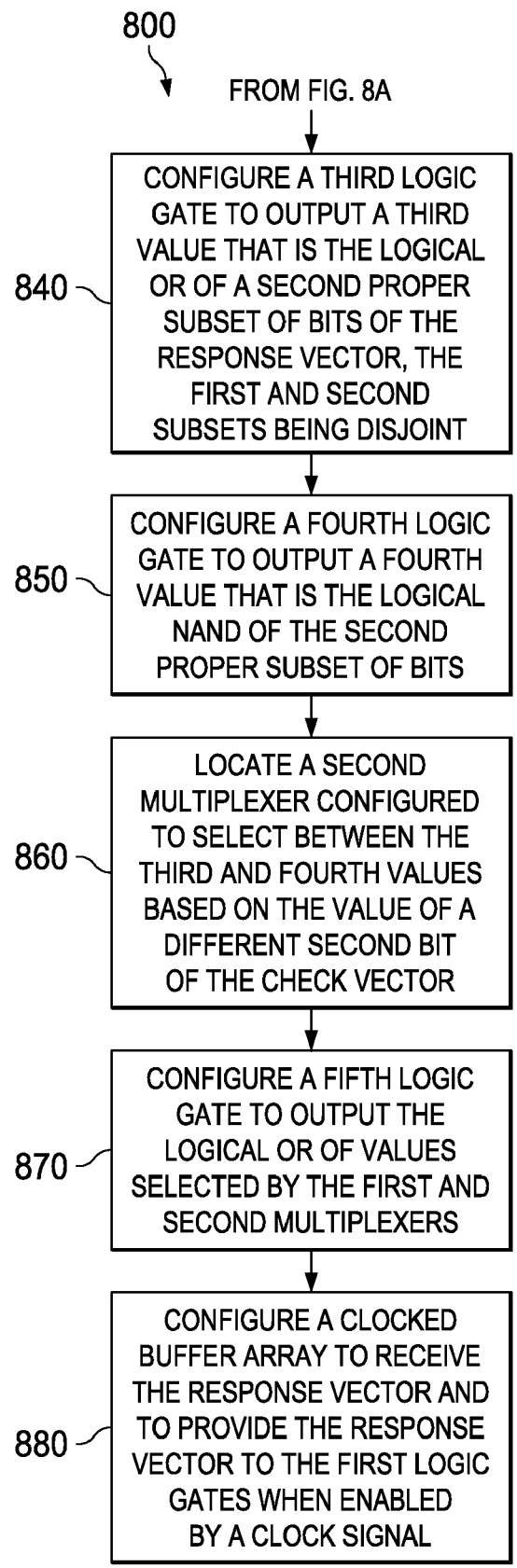

Turning to FIGS. 8A and 8B, illustrated is a method 800 of the disclosure. The steps of the method 800 may be performed in another order than the illustrated order. The method 800 is described without limitation with reference to the features of FIGS. 2, 4 and 5 described previously.

Focusing initially on FIG. 8A, the method 800 begins with a step 810, in which the test controller 250 is formed on a semiconductor substrate. The test controller 250 is configured to output the test vector 280 and the check vector 265 corresponding to the test vector 280.

In a step 820, the memory 230 is configured to receive the test vector 280 and to output the response vector 290 from the memory 230.

In a step 830, the comparator 270 is configured to receive the check vector 265 and the response vector 290. The step 830 includes sub-steps 832, 834, 836. In the step 832 a first logic gate, such as the OR gate 410a, is configured to output a first value that is the logical OR of a proper subset of bits of the response vector 290. In the step 836 a second logic gate, such as the NAND gate 420a, is configured to output a second value that is the logical NAND of the proper subset of bits. In the step 836 a first multiplexer, such as the multiplexer 430a, is configured to select between the first and second values based on the value of a first bit of the check vector 265.

In FIG. 8B, various optional steps are illustrated that may be performed in the method 800. In a step 840, a third logic gate, e.g. the OR gate 410b, is configured to output a third value that is the logical OR of a second proper subset of bits of the response vector 290. The first and second subsets are disjoint.

In a step 850 a fourth logic gate, e.g. the NAND gate 420b, is configured to output a fourth value that is the logical NAND of the second proper subset of bits.

In a step 860 a second multiplexer, e.g. the multiplexer 430b, is configured to select between the third and fourth values based on the value of a different second bit of the check vector 265.

In a step 870 a fifth logic gate, e.g. the OR gate 450, is configured to output the logical OR of values selected by the first and second multiplexers.

In a step 880 the clocked buffer array 710 is optionally configured to receive the response vector 290 from the memory 230 and to provide the response vector 290 to the first and second logic gates when enabled by a clock signal.

Optionally, the fifth logic gate directly receives the values output by the first and second multiplexers. Optionally, the check vector 265 is a 2-bit binary value. Optionally, the test vector 280 is a 16-bit digital value. Optionally the first proper subset consists of even bits of the response vector 290, and the second proper subset consists of odd bits of the response vector 290.

Those skilled in the art to which this application relates will appreciate that other and further additions, deletions, substitutions and modifications may be made to the described embodiments.

What is claimed is:

1. A comparator for determining the fidelity of a response vector output by a memory under test, comprising:
   a first logic gate configured to output a first value that is the logical OR of a first proper subset of bits of said response vector;
   a second logic gate configured to output a second value that is the logical NAND of said proper subset of bits; and
   a first multiplexer configured to select between said first and second values based on the value of a first bit of a check vector corresponding to said response vector.

2. The comparator as recited in claim 1, further comprising:
   a third logic gate configured to output a third value that is the logical OR of a second proper subset of bits of said response vector, said first and second subsets being disjoint;
   a fourth logic gate configured to output a fourth value that is the logical NAND of said second proper subset of bits; and
   a second multiplexer configured to select between said third and fourth values based on the value of a second bit of said check vector.

3. The comparator as recited in claim 2, further comprising a fifth logic gate configured to output the logical OR of values output by said first and second multiplexers.

4. The comparator as recited in claim 3, wherein said third logic gate directly receives said values output by said first and second multiplexers.

5. The comparator as recited in claim 1, further comprising a clocked buffer array configured to receive said response vector and to provide said response vector to said first and second logic gates when enabled by a clock signal.

6. The comparator as recited in claim 1, wherein said check vector is a 2-bit binary value.

7. The comparator as recited in claim 1, wherein said first proper subset consists of even bits of said response vector, and said second proper subset consists of odd bits of said response vector.

8. A method of manufacturing an electronic device, comprising:
   forming on a semiconductor substrate a test controller configured to output a test vector and a check vector corresponding to said test vector;
   configuring a memory to store said test vector and to output a corresponding response vector;
   forming a comparator configured to receive said response vector and said check vector, including:
      configuring a first logic gate to output a first value that is the logical OR of a proper subset of bits of said response vector;
      configuring a second logic gate to output a second value that is the logical NAND of said proper subset of bits; and
      configuring a first multiplexer to select between said first and second values based on the value of a first bit of said check vector.

9. The method as recited in claim 8, further comprising:
   configuring a third logic gate to output a third value that is the logical OR of a second proper subset of bits of said response vector, said first and second subsets being disjoint;
   configuring a fourth logic gate to output a fourth value that is the logical NAND of said second proper subset of bits; and
   locating a second multiplexer configured to select between said third and fourth values based on the value of a different second bit of said check vector.

10. The method as recited in claim 9, further comprising configuring a fifth logic gate to output the logical OR of values selected by said first and second multiplexers.

11. The method as recited in claim 10, wherein said fifth logic gate directly receives said values selected by said first and second multiplexers.

12. The method as recited in claim 8, further comprising configuring a clocked buffer array to receive said response vector and to provide said response vector to said first logic gates when enabled by a clock signal.

13. The method as recited in claim 8, wherein said check vector is a 2-bit digital value.

14. The method as recited in claim 8, wherein said first proper subset consists of even bits of said response vector, and said second proper subset consists of odd bits of said response vector.

15. An integrated circuit, comprising:
   a semiconductor substrate having a memory and a memory test controller formed thereon, said test controller being configured to output a test vector and a check vector corresponding to said test vector, and said memory being configured to store said test vector and to output a corresponding response vector;

a comparator formed on said substrate and configured to receive said response vector and said check vector, said comparator including:
  a first logic gate configured to output a first value that is the logical OR of a proper subset of bits of said response vector;
  a second logic gate configured to output a second value that is the logical NAND of said proper subset of bits; and
  a first multiplexer configured to select between said first and second values based on the value of a first bit of said check vector.

16. The integrated circuit as recited in claim 15, further comprising:
  a third logic gate configured to output a third value that is the logical OR of a second proper subset of bits of said response vector, said first and second proper subsets being disjoint;
  a fourth logic gate configured to output a fourth value that is the logical NAND of said second proper subset; and
  a second multiplexer configured to select between said third and fourth values based on the value of a different second bit of said check vector.

17. The integrated circuit as recited in claim 16, further comprising a fifth logic gate configured to output the logical OR of values output by said first and second multiplexers.

18. The integrated circuit as recited in claim 17, wherein said fifth logic gate directly receives said values output by said first and second multiplexers.

19. The integrated circuit as recited in claim 15, further comprising a clocked buffer array configured to receive said response vector from said memory and to provide said response vector to said first and second logic gates when enabled by a clock signal.

20. The integrated circuit as recited in claim 15, wherein said first proper subset consists of even bits of said response vector, and said second proper subset consists of odd bits of said response vector.

* * * * *